(12) United States Patent
Chang et al.

(10) Patent No.: US 8,729,599 B2
(45) Date of Patent: May 20, 2014

(54) SEMICONDUCTOR DEVICE

(75) Inventors: Yuan-Hsiang Chang, Hsinchu (TW); Sung-Bin Lin, Hsinchu (TW)

(73) Assignee: United Microelectronics Corp., Science Based Industrial Park, Hsin-Chu, (TW)

( * ) Notice: Subject to any disclaimer, the term of this patent is extended or adjusted under 35 U.S.C. 154(b) by 163 days.

(21) Appl. No.: 13/215,194

(22) Filed: Aug. 22, 2011

(65) Prior Publication Data

US 2013/0049066 A1    Feb. 28, 2013

(51) Int. Cl.
*H01L 29/739* (2006.01)

(52) U.S. Cl.
USPC ............ 257/139; 257/E21.382; 257/E29.197; 438/135

(58) Field of Classification Search
USPC .......... 257/453–456, 471–479, 139, E29.197, 257/E21.382; 438/135
See application file for complete search history.

(56) References Cited

U.S. PATENT DOCUMENTS

| | | |
|---|---|---|
| 4,344,081 A | 8/1982 | Pao |
| 4,396,999 A | 8/1983 | Malaviya |
| 4,811,065 A | 3/1989 | Cogan |
| 4,862,244 A | 8/1989 | Yamagishi |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |
| 5,534,721 A | 7/1996 | Shibib |
| 5,811,850 A | 9/1998 | Smayling |
| 5,950,090 A | 9/1999 | Chen |
| 5,998,301 A | 12/1999 | Pham |
| 6,066,884 A | 5/2000 | Krutsick |
| 6,144,538 A | 11/2000 | Chao |
| 6,165,846 A | 12/2000 | Carns |
| 6,245,689 B1 | 6/2001 | Hao |
| 6,277,675 B1 | 8/2001 | Tung |
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |

(Continued)

OTHER PUBLICATIONS

Tsai, Title: High Voltage Device Having Schottky Diode, pending U.S. Appl. No. 12/884,215, filed Sep. 17, 2010.

*Primary Examiner* — Stephen W Smoot
*Assistant Examiner* — Edward Chin
(74) *Attorney, Agent, or Firm* — Winston Hsu; Scott Margo

(57) ABSTRACT

A method for fabricating a semiconductor device includes the following steps. First, a semiconductor substrate is provided, and a first region, a second region and a third region are defined thereon. Then, a first well having a first conductive type is formed in the semiconductor substrate of the first region and the second region, respectively. A semiconductor layer partially overlapping the first well of the second region is formed. Furthermore, a second well having a second conductive type is formed in the semiconductor substrate of the third region and the first well of the second region respectively, where the second well of the second region is disposed underneath the semiconductor layer.

8 Claims, 10 Drawing Sheets

(56) References Cited

U.S. PATENT DOCUMENTS

| | | |
|---|---|---|
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2* | 1/2008 | Park et al. ............... 257/316 |
| 7,358,567 B2 | 4/2008 | Hsu |
| 7,427,552 B2 | 9/2008 | Jin |
| 8,421,181 B2* | 4/2013 | Anderson et al. ........... 257/483 |
| 8,552,495 B2* | 10/2013 | Tsai et al. ................. 257/339 |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0244050 A1* | 11/2006 | Sudou ........................ 257/324 |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1* | 6/2007 | Wu et al. ................... 257/371 |
| 2007/0273001 A1 | 11/2007 | Chen |
| 2008/0006899 A1 | 1/2008 | Kim |
| 2008/0067623 A1* | 3/2008 | Coolbaugh et al. ........ 257/471 |
| 2008/0092094 A1* | 4/2008 | Coolbaugh et al. ............ 716/4 |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 | 6/2009 | Huang |
| 2009/0243027 A1* | 10/2009 | Kato et al. ................. 257/476 |
| 2009/0278208 A1 | 11/2009 | Chang |
| 2009/0294865 A1 | 12/2009 | Tang |
| 2010/0006937 A1* | 1/2010 | Lee .............................. 257/343 |
| 2010/0032758 A1 | 2/2010 | Wang |
| 2010/0096702 A1 | 4/2010 | Chen |
| 2010/0148250 A1 | 6/2010 | Lin |
| 2010/0213517 A1 | 8/2010 | Sonsky |
| 2010/0289058 A1* | 11/2010 | Yang et al. ................. 257/137 |
| 2011/0057263 A1 | 3/2011 | Tang |
| 2012/0068297 A1* | 3/2012 | Tsai ............................ 257/474 |
| 2012/0187520 A1* | 7/2012 | Kato et al. .................. 257/475 |

\* cited by examiner

US 8,729,599 B2

SEMICONDUCTOR DEVICE

BACKGROUND OF THE INVENTION

1. Field of the Invention

The present invention relates to a semiconductor device and a method of fabricating the same, and more particularly, to a semiconductor device having a semiconductor layer used for adjusting the depth of a well, and the method of fabricating the same.

2. Description of the Prior Art

Electrically erasable programmable read only memory (EEPROM) is a kind of non-volatile memory. EEPROM can retain data even when the electricity supply is removed as well as having a re-record function. With the trend towards scaling down the size and increasing the integration of semiconductor devices, electronic products usually include a various internal semiconductor devices for meeting the requirements of low power consumption, fast response and low cost. Furthermore, each semiconductor device has its own performance and particular manufacturing process demands.

EEPROM may include metal-oxide-semiconductor transistors (MOS) and Schottky diodes. A Schottky diode is constructed by a metal-to-semiconductor interface where this interface is known to have rectifying characteristics. Moreover, a Schottky diode provides rectification as a result of unipolar current transport across the metal-semiconductor contact. For example, a Schottky diode's voltage drop at a forward bias of about 1 mA is in the rage of 0.15 V to 0.45 V, while the conventional silicon diode is about 0.6 V. Accordingly, the Schottky diode has the advantages of low threshold voltage and fast response speed when switching between forward and reverse bias voltage in comparison with the PN junction diode, and is therefore widely used for reducing power consumption and improving switching speed.

As the size of MOS is gradually minimized, how to improve the carrier mobility so as to elevate the response speed of the MOS has become a major topic for study in the semiconductor field.

How to integrate processes of different semiconductor devices such as MOS and Schottky diode to facilitate the functions of electronic products and save on manufacturing costs is another important issue in the field.

SUMMARY OF THE INVENTION

It is therefore one of the objectives of the present invention to provide a semiconductor device and a method of fabricating the same to integrate processes of different semiconductor devices for saving on manufacturing costs, by utilizing a semiconductor layer for adjusting the depth of a well.

An exemplary embodiment of the present invention provides a semiconductor device. The semiconductor device includes a semiconductor substrate, and a first well having a first conductive type is disposed in the semiconductor substrate. Furthermore, a first electrode and a second electrode are disposed on the first well, and a semiconductor layer is also disposed on the first well and located between the first electrode and the second electrode. A second well having a second conductive type is disposed in the first well underneath the semiconductor layer. Additionally, a heavily doped region having a first conductive type is disposed in the first well underneath the second electrode.

An exemplary embodiment of the present invention provides a method for forming a semiconductor device including the following steps. First, a semiconductor substrate having a first region, a second region and a third region defined thereon is provided. Then, a first ion implantation process is performed for respectively forming a first well having a first conductive type in the semiconductor substrate of the first region and in the semiconductor substrate of the second region. Subsequently, a semiconductor layer partially overlapping the first well of the second region is formed. A second ion implantation process is performed for respectively forming a second well having a second conductive type in the semiconductor substrate of the third region and in the first well of the second region, where the second well of the second region is disposed underneath the semiconductor layer.

The present invention provides a semiconductor device having the semiconductor layer disposed on the formed well and a method of fabricating the same. The semiconductor layer may serve as a mask during the ion implantation process for adjusting a depth of the later-formed well to enhance the insulation effect. Furthermore, resistance can be increased by the depletion effect at the edge of the well and the extending pathway of signals due to the disposition of the well; accordingly, the punch through current caused by the high voltage signal can be prevented from damaging the semiconductor device, and the reliability of the semiconductor device performance may thereby be facilitated. Additionally, the present invention also includes the integration of different semiconductor device processes such as MOS process and Schottky diode process for saving on costs and shortening the manufacturing period.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
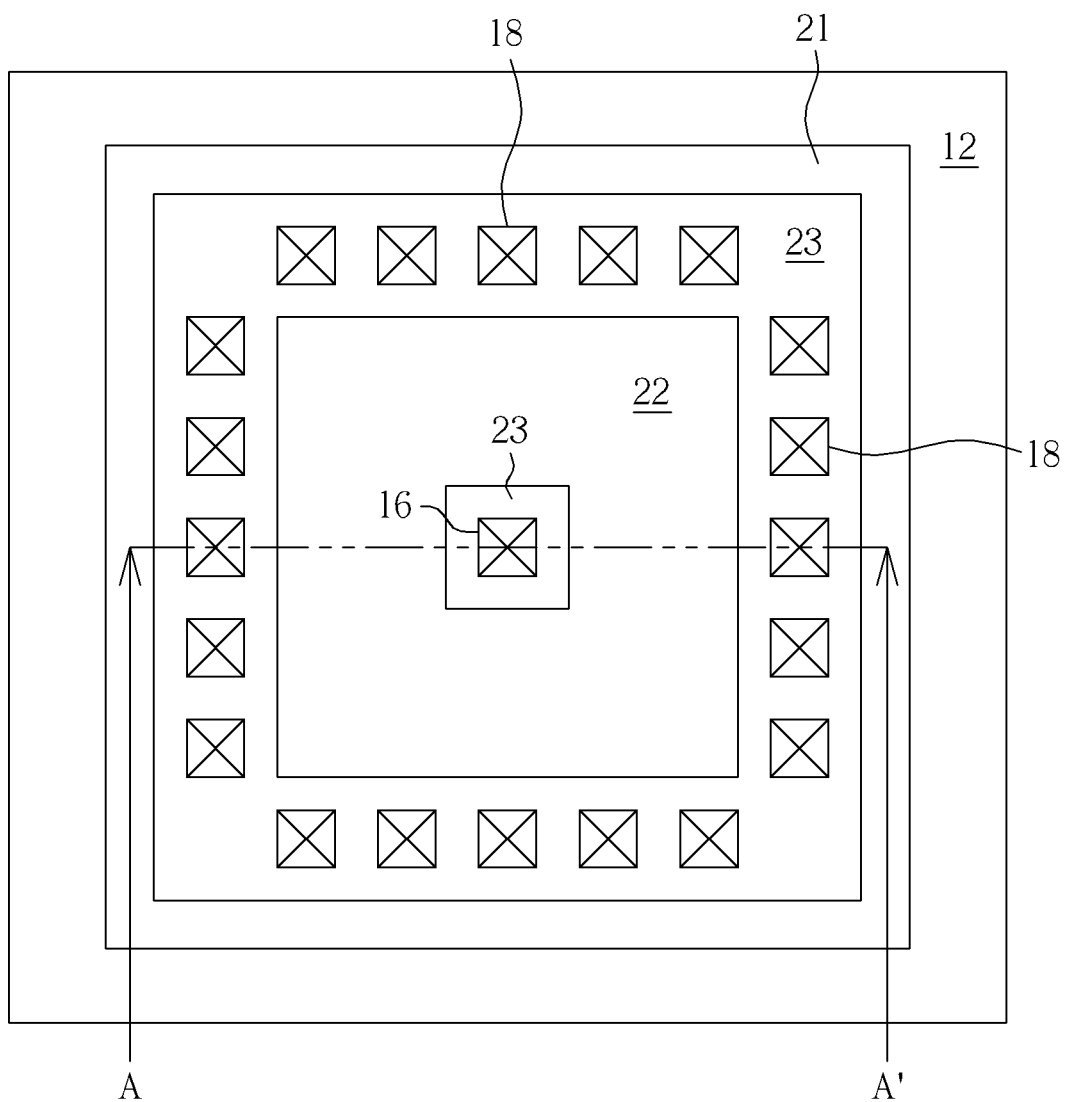
FIG. 1 illustrates a semiconductor device according to an exemplary embodiment of the present invention.
Figure 2:
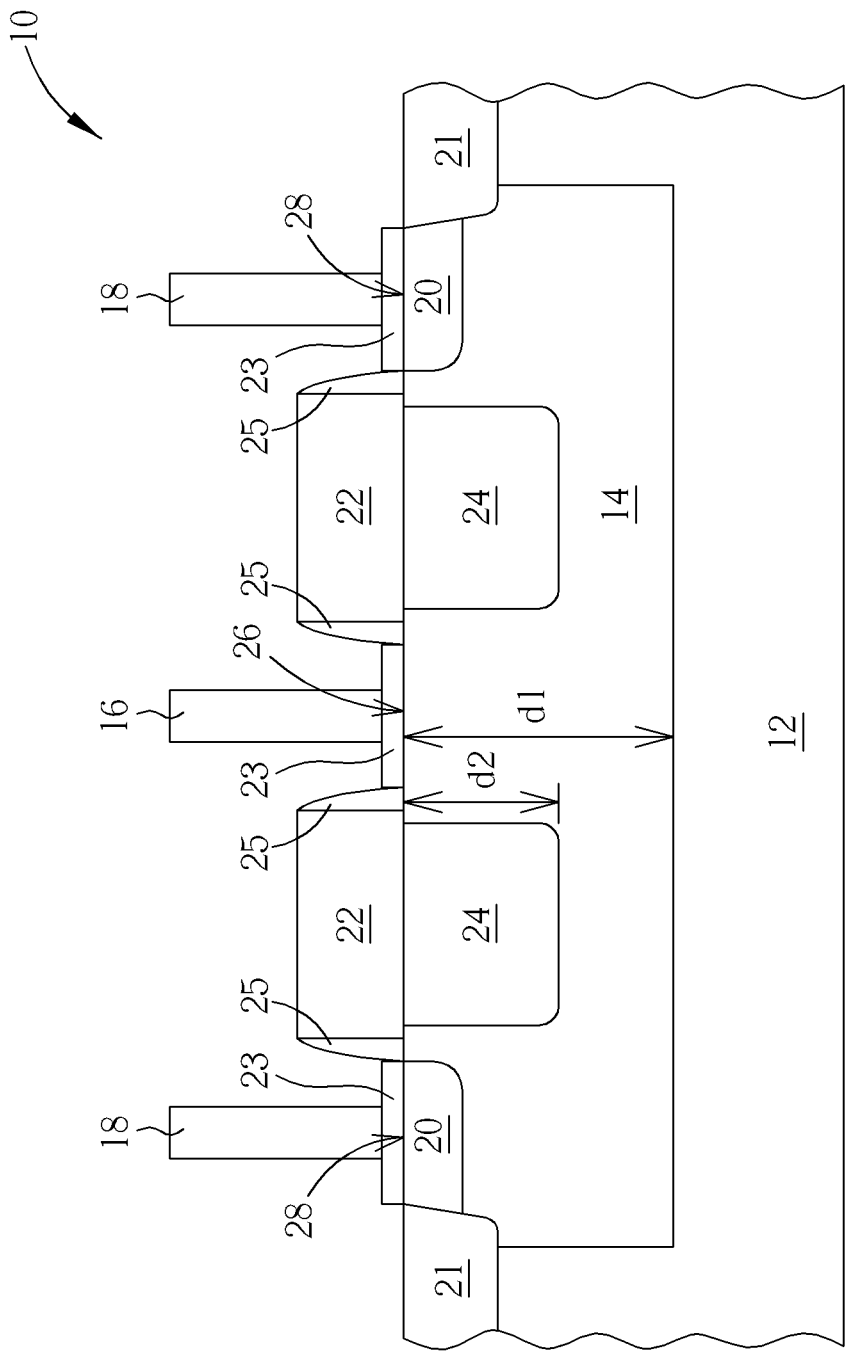
FIG. 2 is a cross-sectional view illustrating the semiconductor device taken along the line AA' of FIG. 1 according to an exemplary embodiment of the present invention.

Please refer to FIG. 1 and FIG. 2. FIG. 1 illustrates a semiconductor device according to an exemplary embodiment of the present invention. FIG. 2 is a cross-sectional view illustrating the semiconductor device taken along the line AA' of FIG. 1 according to an exemplary embodiment of the present invention. As shown in FIG. 1 and FIG. 2, the semiconductor device 10 is a Schottky diode. The semiconductor device 10 includes a semiconductor substrate 12, a first well 14, a first electrode 16, a second electrode 18, a heavily doped region 20, a shallow trench isolation (STI) 21, a semiconductor layer 22 and a second well 24. The semiconductor substrate 12 could be a substrate composed of AsGa, silicon on insulator (SOI) layer, epitaxial layer, SiGe layer or other semiconductor material. The first well 14 having a first conductive type is disposed in the semiconductor substrate 12 by performing an ion implantation process with the dopants having the first conductive type. The first conductive type includes n-type or p-type. In this exemplary embodiment, the semiconductor substrate 12 is preferably a p-type semiconductor substrate, and the first well 14 is preferably an n-type well, but not limited thereto.

The first electrode 16 is disposed on the first well 14, and a Schottky contact 26 is further included between the first well 14 and the first electrode 16. The heavily doped region 20 having a first conductive type is disposed in the first well 14 by performing an ion implantation process with the dopants having the first conductive type. The first well 14 and the heavily doped region 20 have the same conductive type, and a dopant concentration of the heavily doped region 20 is substantially higher than that of the first well 14. In this exemplary embodiment, the heavily doped region 20 is preferably an n-type well, but not limited thereto. The second electrode 18 is disposed on the first well 14, and the heavily doped region 20 is disposed in the first well 14 underneath the second electrode 18. An ohmic contact 28 is further included between the heavily doped region 20 and the second electrode 18. The semiconductor layer 22 may include, for example, a polysilicon layer, but is not limited thereto. The semiconductor layer 22 disposed on the first well 14 is located between the first electrode 16 and the second electrode 18. The semiconductor layer 22 may further include a spacer 25, and the material of the spacer 25 could be high temperature oxide (HTO), silicon nitride, silicon oxide, or HCD-SiN formed by hexachlorodisilane ($Si_2Cl_6$). Moreover, the second well 24 having a second conductive type is disposed in the first well 14 underneath the semiconductor layer 22 by performing an ion implantation process with the dopants having the second conductive type, and the second well 24 may contact the semiconductor layer 22. The second conductive type includes p-type or n-type. In this exemplary embodiment, the second well 24 is preferably a p-type well, but not limited thereto.

As a salicide layer process is performed to dispose a salicide layer 23 between the first well 14 and the first electrode 16/the second electrode 18, the semiconductor layer 22 may provide a self-alignment function, i.e. the semiconductor layer 22 defines non-salicide regions. In other words, only a portion of the silicon substrate of the first well 14 uncovered by the semiconductor layer 22 can be reacted with metal to form the salicide layer 23. Accordingly, the semiconductor layer 22 may be used to divide the predetermined location of the first electrode 16 from that of the second electrode 18. The semiconductor layer 22 neighbors and defines the location of Schottky contact 26 and the location of ohmic contact 28. In this exemplary embodiment, the semiconductor layer 22 covers the second well 24 to serve as a mask during the ion implantation process of forming the second well 24 and defines the location of the second well 24. The second well 24 underneath the semiconductor layer 22 is located between the Schottky contact 26 and the ohmic contact 28. The second well 24 may surround the Schottky contact 26 without direct contact and adjust a depth d2 of the second well 24 to be smaller than a depth d1 of the first well 14 for enhancing the insulation effect of the second well 24.

As a forward bias is provided to the semiconductor device 10, the signal is delivered from the heavily doped region 20, through the first well 14, and to the Schottky contact 26. The disposition of the second well 24 may increase the resistance due to the depletion effect between the first well 14 and the second well 24 having the different conductive types, and the extending pathway. The higher resistance could prevent the punch through current caused by the high voltage signal from damaging the semiconductor device; consequently, the reverse voltage and the performance reliability of the semiconductor device 10 may be facilitated.

Figure 3:
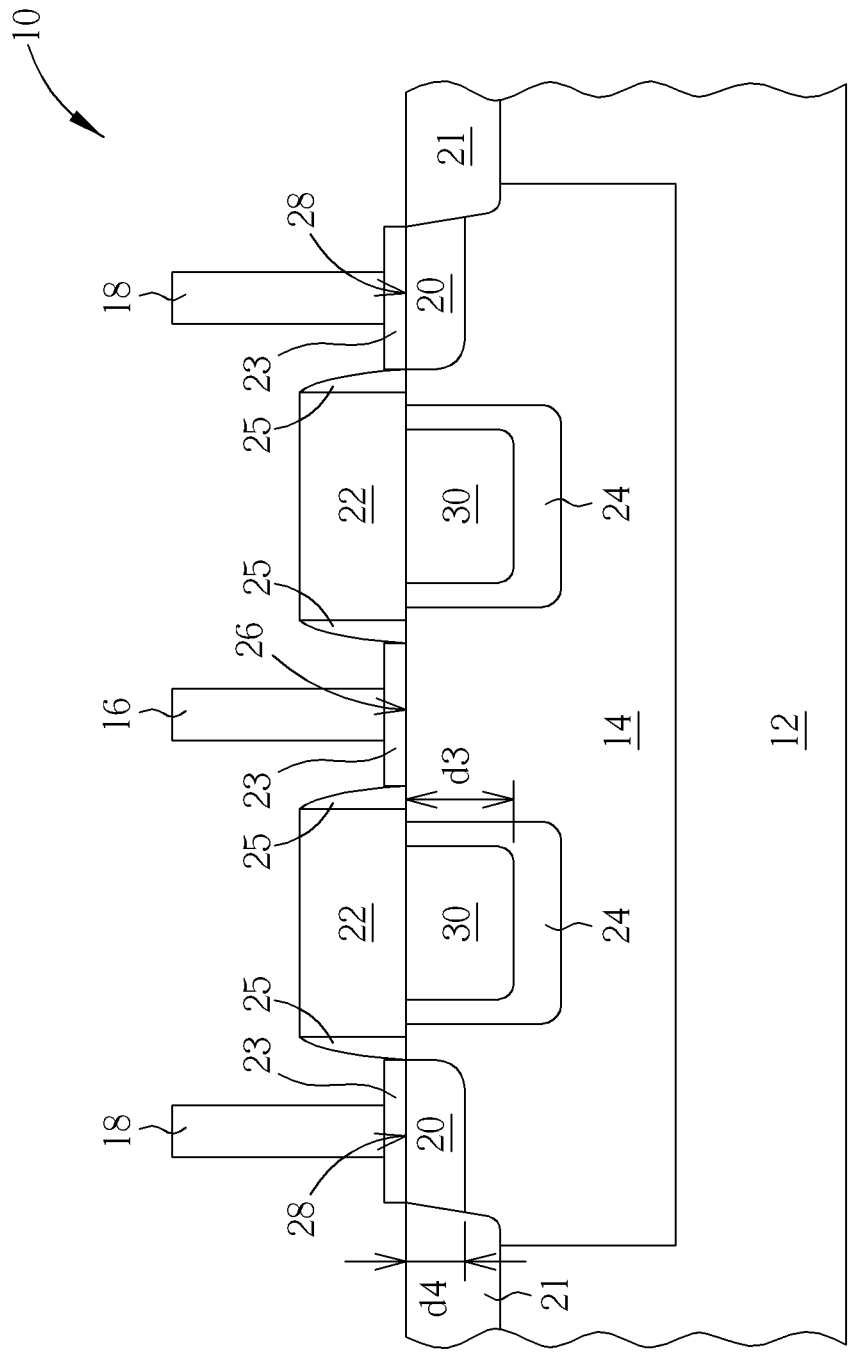
FIG. 3 illustrates a semiconductor device according to another exemplary embodiment of the present invention.

Please refer to FIG. 3. FIG. 3 illustrates a semiconductor device according to another exemplary embodiment of the present invention. As shown in FIG. 3, in comparison with the illustrated exemplary embodiment, the semiconductor device further includes an insulating layer 30 disposed in the second well 24. The material of the insulating layer 30 may be silicon oxide or other low-k (low dielectric constant) material, and the insulating layer 30 includes at least a shallow trench isolation (STI). A depth d3 of the insulating layer 30 is substantially smaller than the depth d2 of the second well 24. The disposition of the insulating layer 30 further improves the insulation effect of the second well 24. The insulating layer 30 is preferably disposed underneath the semiconductor layer 22 where the insulating layer 30 may contact the semiconductor layer 22 directly, and be surrounded by the second well 24. Preferably, the depth d3 of the insulating layer 30 is larger than a depth d4 of the heavily doped region 20.

Figure 4:
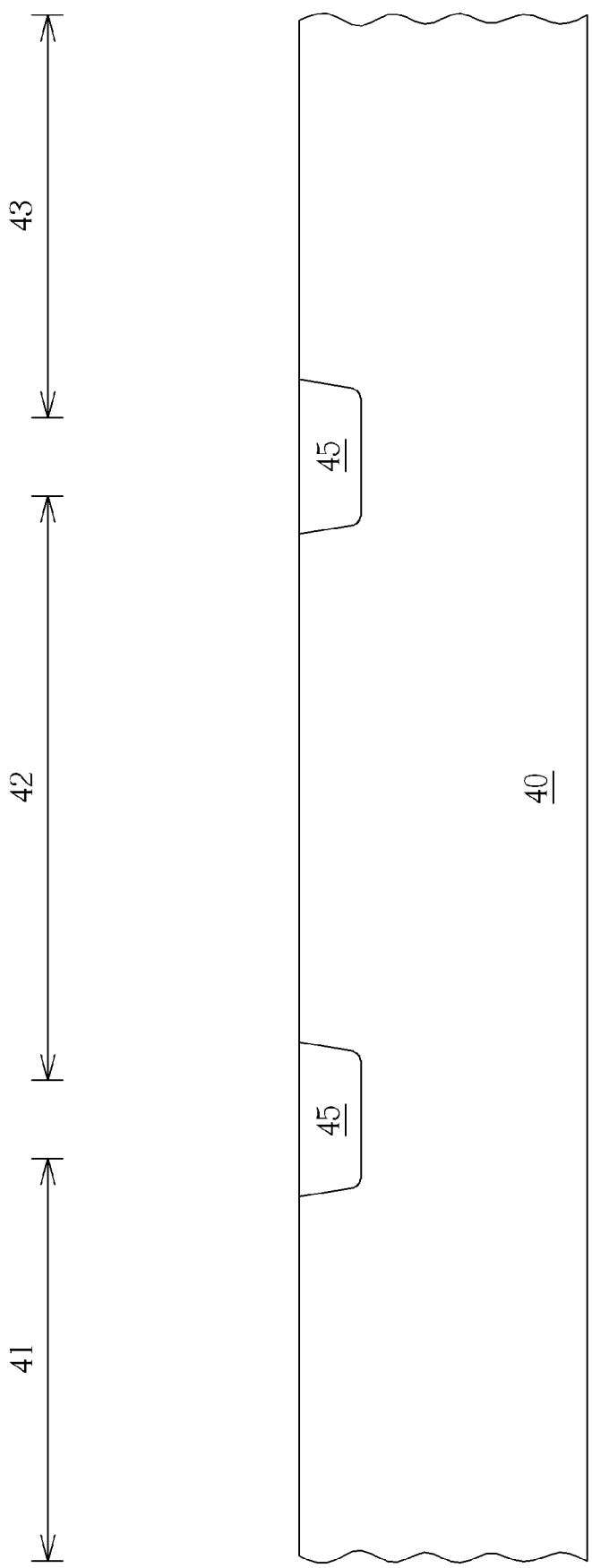
FIG. 4 through FIG. 7 illustrate a method for forming a semiconductor device according to a preferred exemplary embodiment of the present invention.

Please refer to FIG. 4 through FIG. 7. FIG. 4 through FIG. 7 illustrate a method for forming a semiconductor device according to a preferred exemplary embodiment of the present invention. As shown in FIG. 4, at first, a semiconductor substrate 40 having a first region 41, a second region 42 and a third region 43 defined thereon is provided. The semiconductor substrate 40 could be a substrate composed of AsGa, silicon on insulator (SOI) layer, epitaxial layer, SiGe layer or other semiconductor material. The semiconductor substrate 40 further includes a shallow trench isolation (STI) 45 disposed between the first region 41 and the second region 42, the first region 41 and the third region 43, or the second region 42 and the third region 43 for separating these regions. The STI 45 may be made of insulating materials such as silicon oxide. As the STI processes are known to those skilled in the art, the details are omitted herein for brevity. Semiconductor devices, such as a p-type metal-oxide-semiconductor transistor (PMOS), an n-type metal-oxide-semiconductor transistor (NMOS), or a metal-oxide-semiconductor transistor having a strained silicon structure (strained-Si MOS) may be formed simultaneously or in order on the first region 41 and the third region 43, but the forming process is not limited thereto. Furthermore, the semiconductor device of the present invention such as the Schottky diode illustrated in FIG. 2 or FIG. 3 is predetermined to be disposed in the second region 42. The semiconductor device process of the present invention should be integrated into the semiconductor device process, such as the logical transistor process or the high voltage transistor process, performed in the first region 41 and the third region 43.

Figure 5:
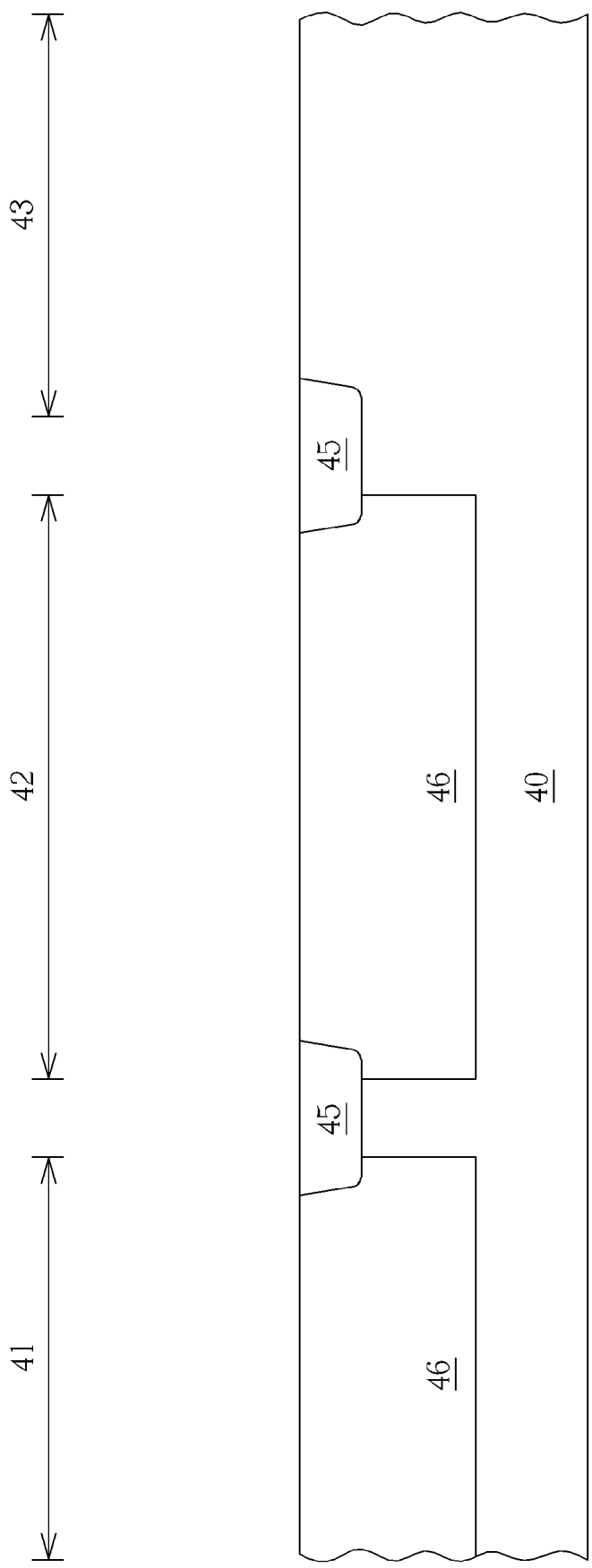

Subsequently, as shown in FIG. 5, an ion implantation process is performed for respectively forming a first well 46 having a first conductive type in the semiconductor substrate 40 of the first region 41 and in the semiconductor substrate 40 of the second region 42. The first conductive type includes n-type or p-type. In this exemplary embodiment, the semiconductor substrate 40 is preferably a p-type semiconductor substrate, and the first well 46 is preferably an n-type well, but not limited thereto.

Figure 6:
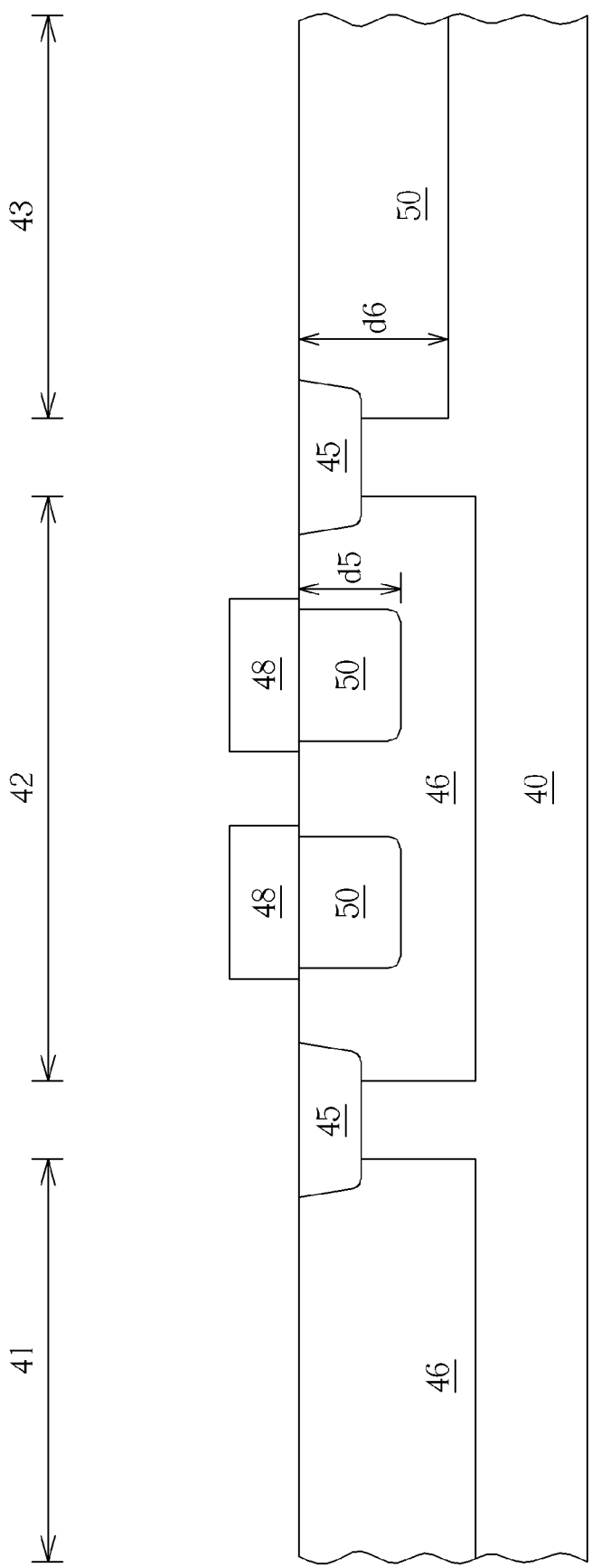

As shown in FIG. 6, a semiconductor layer 48 is formed to partially overlap the first well 46 of the second region 42. The semiconductor layer 48 may be a polysilicon layer, but not limited thereto. The method of forming the semiconductor layer 48 includes a photolithography process, and the steps are illustrated below. At first, a semiconductor layer (not shown) and a hard mask layer (not shown) are formed in order on the semiconductor substrate 40. Then, the hard mask is patterned and an etching process follows. A portion of the semiconductor layer uncovered by the hard mask layer is removed to form the patterned semiconductor layer 48. The etching process includes a dry etching process or wet etching process. Afterward, the hard mask layer is removed. The method of patterning the semiconductor layer is not limited thereto.

An ion implantation process is performed for respectively forming a second well 50 having a second conductive type in the semiconductor substrate 40 of the third region 43 and in the first well 46 of the second region 42. Furthermore, the second well 50 of the second region 42 is disposed underneath the semiconductor layer 48. It should be appreciated that the disposition of the semiconductor layer 48 can adjust the depth of the well formed by the ion implantation process. Even if the energy and the dopant concentration of the ion implantation process performed in the second region 42 are the same as that in the third region 43, a depth d5 of the second well 50 in the second region 42 is smaller than a depth d6 of the second well 50 in the third region 43. The second conductive type includes p-type or n-type. In this exemplary embodiment, the second well 50 is preferably a p-type well, but not limited thereto. The order of patterning the semiconductor layer and forming the second well could be modified according to the process demands.

Figure 7:
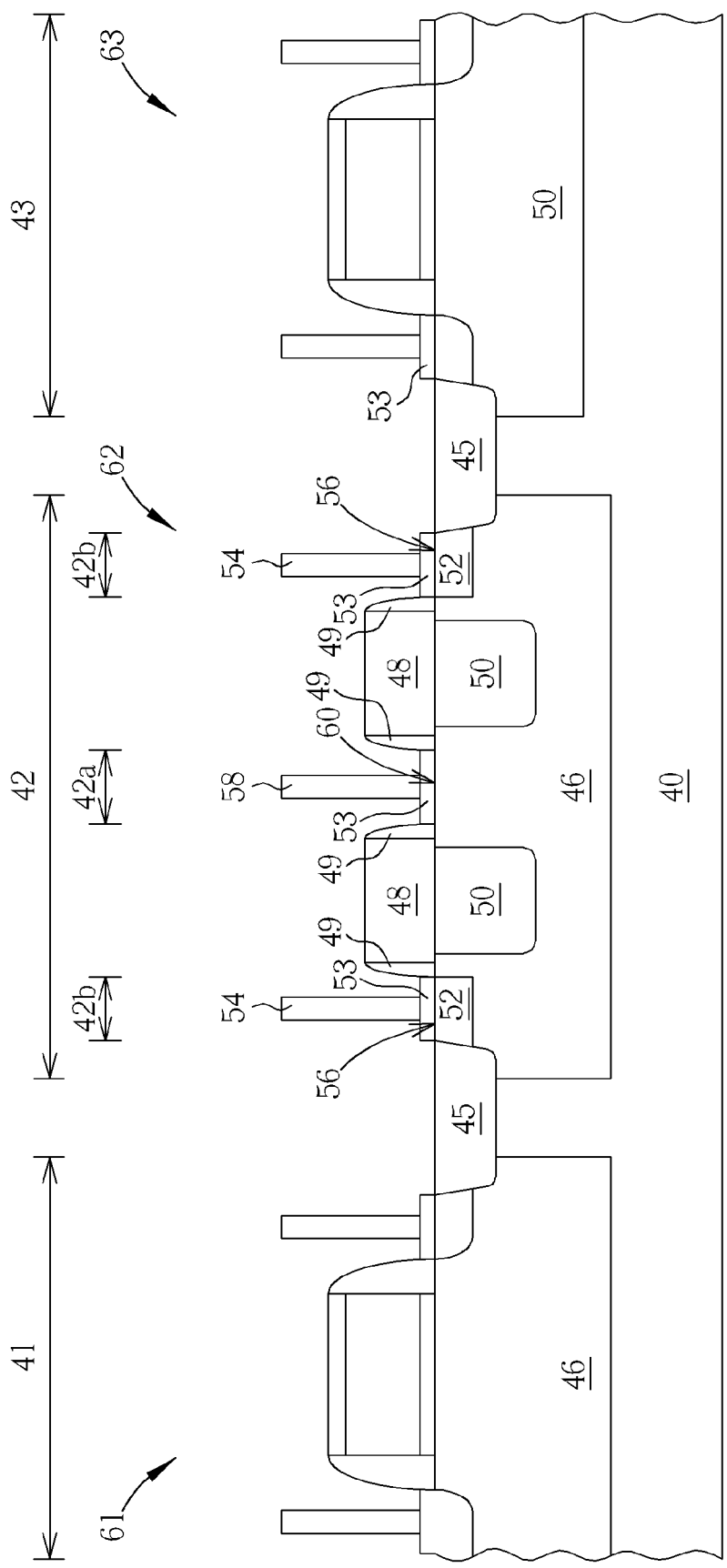

As shown in FIG. 7, a Schottky contact region 42a and an ohmic contact region 42b are defined in the first well 46 and not covered by the semiconductor layer 48 in the second region 42. In other words, the semiconductor layer 48 may both neighbor and be used to define the Schottky contact region 42a and the ohmic contact region 42b. A spacer 49 could be formed on the sides of the semiconductor layer 48 as the spacer process is performed in the first region 41 or in the third region 43. As the spacer process is commonly known to those skilled in the art in this field, the corresponding details are omitted herein for the sake of brevity. The material of the spacer 49 could be high temperature oxide (HTO), silicon nitride, silicon oxide, or HCD-SiN formed by hexachlorodisilane ($Si_2Cl_6$), but not limited thereto. Furthermore, a heavily doped region 52 having the first conductive type is formed in the semiconductor substrate 40 of the ohmic contact region 42b. In the second region 42, a dopant concentration of the heavily doped region 52 is higher than a dopant concentration of the first well 46. The heavily doped region 52 could be formed simultaneously as other semiconductor processes such as the formation of source/drain performed in the first region 41 or the third region 43. A second electrode 54 is then formed on the heavily doped region 52 to form an ohmic contact 56, and a first electrode 58 is formed on the first well 46 of the Schottky contact region 42a to form a Schottky contact 60. Before forming the first electrode 58 and the second electrode 54, a salicide layer 53 is formed on the semiconductor substrate 40 not covered by the semiconductor layer 48 in the second region 42, i.e. the Schottky contact region 42a and the ohmic contact region 42b. The semiconductor layer 48 may provide a self-alignment function. Moreover, with the deposition of the semiconductor layer 48, the second well 50 can be formed between the ohmic contact 56 and the Schottky contact 60, and further surround the Schottky contact 60 without directly contacting the Schottky contact 60, where the depth d5 of the second well 50 is smaller than the depth of the first well 46 in the second region 42. Accordingly, a Schottky diode structure 62 is completed in the second region 62. Through other known semiconductor processes, at least a high-voltage transistor 61 may be disposed in the semiconductor substrate 40 of the first region 41, and at least a low-voltage transistor 63 may be disposed in the semiconductor substrate 40 of the third region 42. Some semiconductor elements such as the gate or source/drain are formed prior to the formation of the salicide layer 53.

Figure 8:
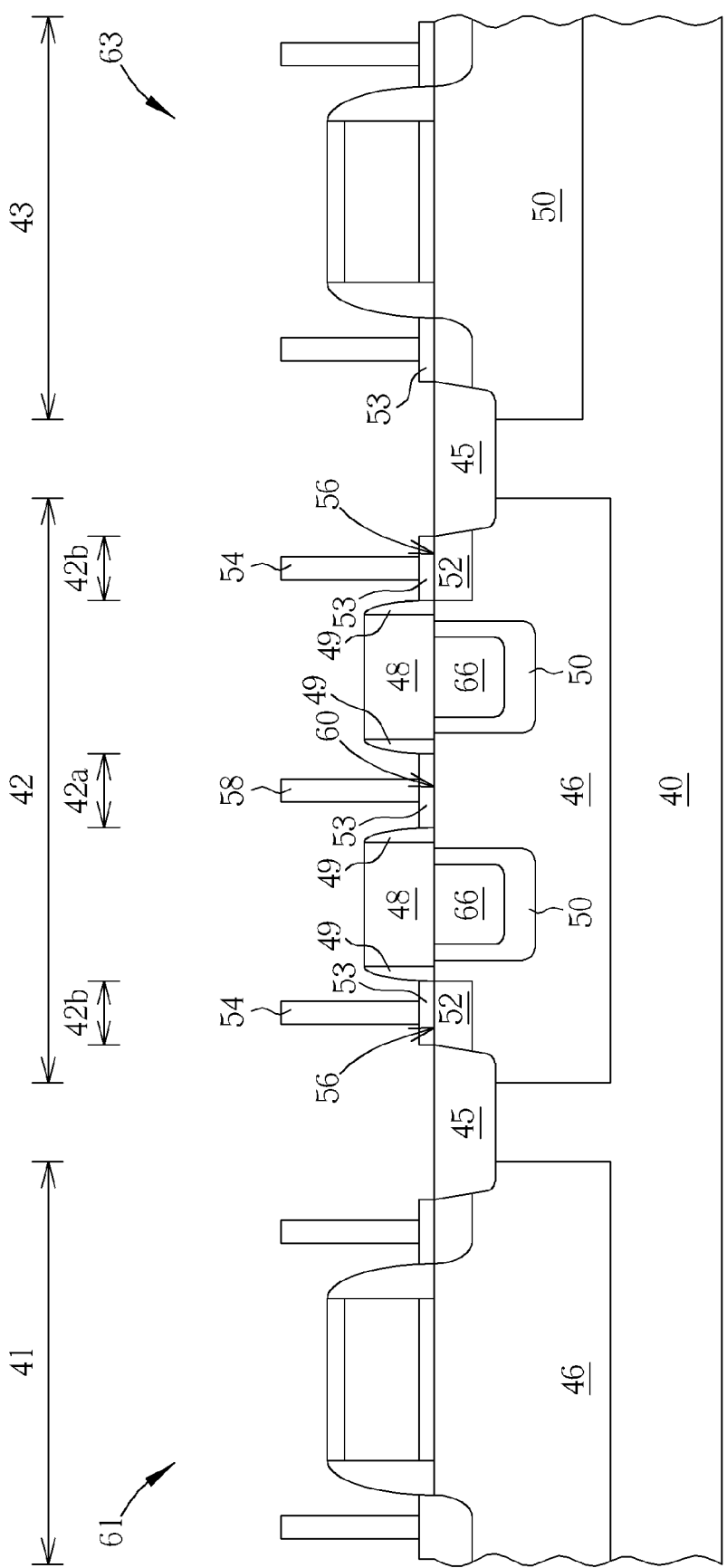
FIG. 8 illustrates a method for forming a semiconductor device according to another exemplary embodiment of the present invention.

Please refer to FIG. 8. FIG. 8 illustrates a method for forming a semiconductor device according to another exemplary embodiment of the present invention. As shown in FIG. 8, before the formation of the semiconductor layer 48, an insulating layer 66 is formed in the semiconductor substrate 40 in the second region 42 where the semiconductor layer 48 is predetermined to form. A depth of the insulating layer 66 is substantially smaller than a depth of the later-formed second well 50 in the second region 42. The material of the insulating layer 66 may be silicon oxide or other low-k material, and the insulating layer 66 includes at least a shallow trench isolation (STI) 45 which may be formed simultaneously as the STI 45 is formed to divide the regions. The disposition of the insulating layer 66 may further improve the insulation effect of the second well 50. The insulating layer 66 is preferably disposed underneath the semiconductor layer 48 where the insulating layer 66 may contact the semiconductor layer 48 directly, and is surrounded by the second well 50. Preferably, the depth of the insulating layer 66 is substantially larger than a depth of the heavily doped region 52, but it is not limited thereto.

Figure 9:
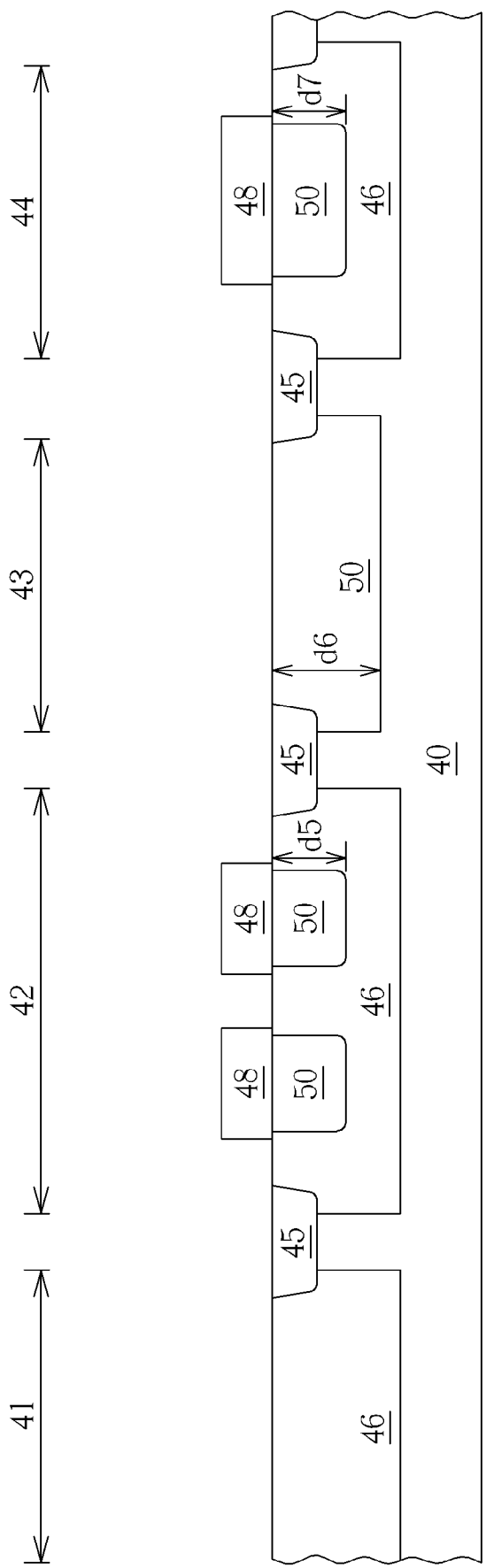
FIG. 9 and FIG. 10 illustrate a method for forming a semiconductor device according to another exemplary embodiment of the present invention.
Figure 10:
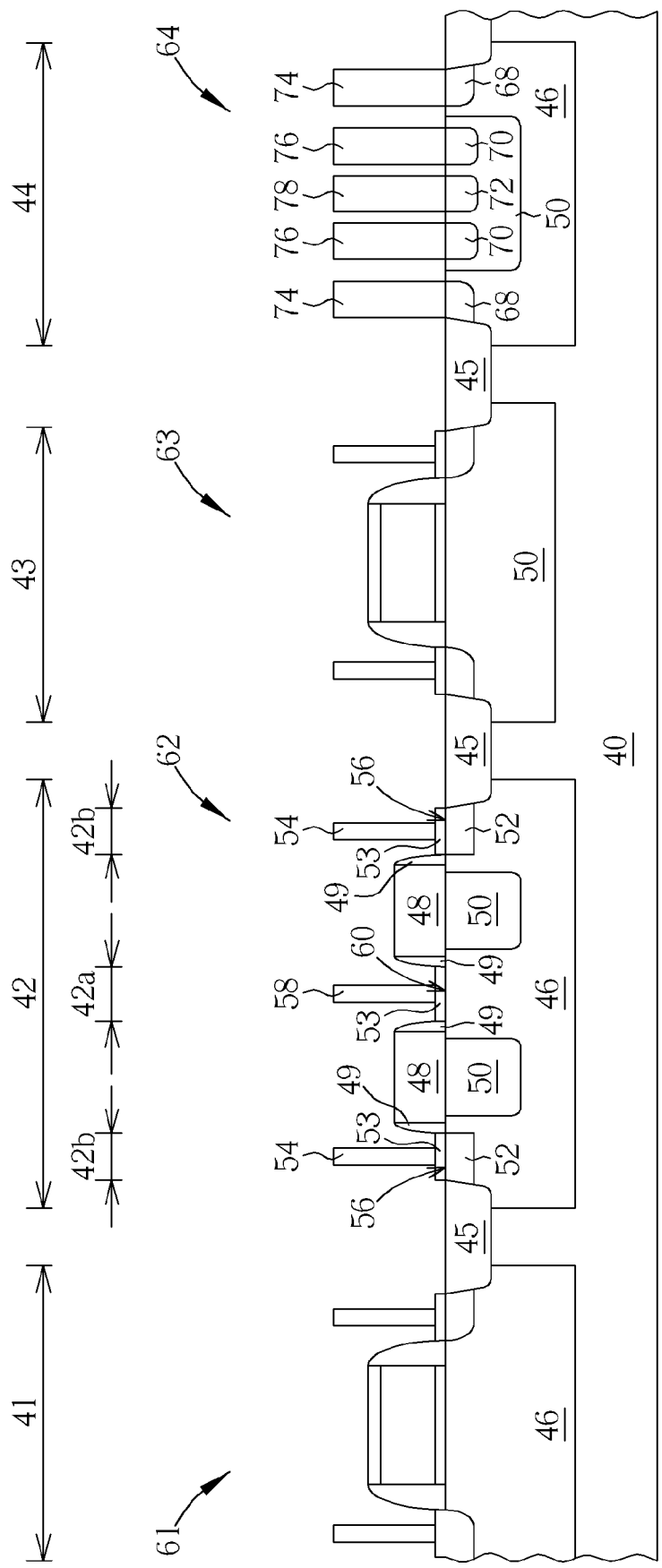

Please refer to FIG. 9 and FIG. 10. FIG. 9 and FIG. 10 illustrate a method for forming a semiconductor device according to another exemplary embodiment of the present invention. As shown in FIG. 9, in comparison with the illustrated exemplary embodiments, a fourth region 44 is further defined in the semiconductor substrate 40. Subsequently, an ion implantation process is performed for simultaneously forming a first well 46 having the first conductive type in the semiconductor substrate 40 of the first region 41, the second region 42 and the fourth region 44. Then, the semiconductor layer 48 is formed to partially overlap the first well 46 of the second region 42 and the first well 46 of the third region 42 and the fourth region 44. An ion implantation process is further performed for simultaneously forming a second well 50 having the second conductive type in the semiconductor substrate 40 of the third region 43, and in the first well 46 of the second region 42 and the fourth region 44. It is appreciated that the second well 50 of the second region 42 and the second well 50 of the fourth region 44 are both under the semiconductor layer 48. In comparison with the third region 43 excluding the semiconductor layer 48 where the dopant could be implanted directly to the semiconductor substrate 40, the dopant should penetrate through the semiconductor layer 48 before reaching the first well 46 in the second region 42 and the fourth region 44. Accordingly, the depth d5/d7 of the second well 50 in the second region 42/the fourth region 44 is substantially smaller than the depth d6 of the second well 50 in the third region 43.

As shown in FIG. 10, the Schottky diode structure 62 is formed in the second region 42 as illustrated in the previous exemplary embodiment, and another semiconductor device such as a bipolar junction transistor (BJT) is formed in the fourth region 44. The method of forming the semiconductor device in the fourth region includes the following steps. At first, the semiconductor layer 48 in the fourth region 44 is removed, and then a first doped region 68 is formed in the first well 46 of the fourth region 44. A second doped region 70 and a third doped region 72 are respectively formed in the second well 50 of the fourth region 44. Subsequently, in the fourth region 44, a first electrode 74 is formed on the first doped region 68 to form a collector, a second electrode 76 is formed on the second doped region 70 to form a base, and a third electrode 78 is formed on the third doped region 72 to form an emitter, but this is not limited thereto. Accordingly, a BJT structure 64 is completed in the fourth region 44.

In conclusion, the present invention provides a semiconductor device having a semiconductor layer disposed on a formed well and a method of fabricating the same. The semiconductor layer may serve as a mask during an ion implantation process for adjusting a depth of the later-formed well to enhance the insulation effect. Resistance can be increased by the depletion effect at the edge of the well and the extending pathway of signals due to the disposition of the well; accordingly, the punch through current caused by the high voltage signal can be prevented from damaging the semiconductor device, and the reliability of the semiconductor device performance may thereby be facilitated. The present invention also includes the integration of different semiconductor device processes: for example, the processes of Schottky diode and the BJT are integrated into the process of EEPROM as illustrated in the previous exemplary embodiment, in order to save on costs and shorten the manufacturing period.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a semiconductor substrate;
a first well having a first conductive type and being disposed in the semiconductor substrate;
a first electrode disposed on the first well;
a second electrode disposed on the first well;
a semiconductor layer disposed on the first well and located between the first electrode and the second electrode;
a second well having a second conductive type and being disposed in the first well underneath the semiconductor layer, wherein the second well is totally covered by the semiconductor layer; and
a heavily doped region having a first conductive type and being disposed in the first well underneath the second electrode.

2. The semiconductor device according to claim 1, wherein the first conductive type comprises n-type or p-type, the second conductive type comprises p-type or n-type, and the first conductive type is different from the second conductive type.

3. The semiconductor device according to claim 1, further comprising a Schottky contact disposed between the first electrode and the first well.

4. The semiconductor device according to claim 1, further comprising an ohmic contact disposed between the second electrode and the heavily doped region.

5. The semiconductor device according to claim 1, wherein the semiconductor layer comprises a polysilicon layer.

6. The semiconductor device according to claim 1, further comprising an insulating layer disposed in the second well.

7. The semiconductor device according to claim 6, wherein a material of the insulating layer comprises silicon oxide or other low-k (low dielectric constant) material.

8. The semiconductor device according to claim 6, wherein the insulating layer comprises at least a shallow trench isolation (STI).

* * * * *